(12) United States Patent
Yun et al.

(10) Patent No.: US 9,948,316 B1
(45) Date of Patent: Apr. 17, 2018

(54) ANALOG-TO-DIGITAL CONVERTER AND CMOS IMAGE SENSOR INCLUDING THE SAME

(71) Applicant: SK hynix Inc., Gyeonggi-do (KR)

(72) Inventors: Gun-Hee Yun, Gyeonggi-do (KR); Hyun-Mook Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/679,604

(22) Filed: Aug. 17, 2017

(30) Foreign Application Priority Data

Dec. 21, 2016 (KR) ........................ 10-2016-0175386

(51) Int. Cl.
*H03M 1/12* (2006.01)
*H04N 5/3745* (2011.01)

(52) U.S. Cl.
CPC .......... *H03M 1/12* (2013.01); *H04N 5/37455* (2013.01)

(58) Field of Classification Search
CPC .............................. H03M 1/12; H04N 5/37455
USPC ................................................ 341/155, 169
See application file for complete search history.

(56) References Cited

U.S. PATENT DOCUMENTS

| | | | | |
|---|---|---|---|---|
| 6,956,413 B2 * | 10/2005 | Bailey | .................... | H03K 4/026 327/131 |
| 8,441,387 B2 * | 5/2013 | Wang | .................. | H03M 1/1014 341/155 |
| 8,482,448 B2 * | 7/2013 | Burm | ....................... | H03K 4/06 341/166 |
| 8,759,737 B2 * | 6/2014 | Egawa | ................. | H04N 5/3742 250/208.1 |

FOREIGN PATENT DOCUMENTS

KR 1020060087130 8/2006
KR 1020170090674 8/2017

\* cited by examiner

*Primary Examiner* — Brian Young
(74) *Attorney, Agent, or Firm* — IP & T Group LLP (57) ABSTRACT

An analog-to-digital converter includes a ramp signal generation unit suitable for decreasing a voltage range of a ramp signal in reverse proportion to a multiple of a gain and repeatedly generating the ramp signal by the multiple of the gain; a comparator suitable for repeatedly outputting a comparison signal by the multiple of the gain in response to the ramp signal; and a counter suitable for performing a counting operation in response to the comparison signal.

18 Claims, 6 Drawing Sheets

ANALOG-TO-DIGITAL CONVERTER AND CMOS IMAGE SENSOR INCLUDING THE SAME

CROSS-REFERENCE TO RELATED APPLICATION

The present application claims priority of Korean Patent Application No. 10-2016-0175386, filed on Dec. 21, 2016, which is incorporated herein by reference in its entirety.

BACKGROUND

1. Field

Exemplary embodiments of the present invention relate to an analog-to-digital converter and a complementary metal oxide semiconductor (CMOS) image sensor (CIS) including the analog-to-digital converter.

2. Description of the Related Art

In the case of a conventional analog-to-digital converter (ADC), in order to increase an analog gain, a separate amplifier has to be added at the front end of the ADC or the voltage range of a ramp signal (or ramp output voltage) has to be decreased (i.e., the slope of a ramp signal has to be decreased).

The former method may increase the area and the power consumption in the ADC. In accordance with the latter method, the voltage range of a ramp signal is decreased as the gain increases, thereby making the ramp signal vulnerable to noise. That is, the latter method may deteriorate the signal-to-noise ratio (SNR).

SUMMARY

Various embodiments are directed to an analog-to-digital converter for improving an operation speed by repeating an operation in proportion to a gain while decreasing the voltage range of a ramp signal in reverse proportion to the gain and a complementary metal oxide semiconductor (CMOS) image sensor (CIS) including the same.

In an embodiment, an analog-to-digital converter may include a ramp signal generation unit suitable for decreasing a voltage range of a ramp signal in reverse proportion to a multiple of a gain and repeatedly generating the ramp signal by the multiple of the gain; a comparator suitable for repeatedly outputting a comparison signal by the multiple of the gain in response to the ramp signal; and a counter suitable for performing a counting operation in response to the comparison signal.

In an embodiment, an analog-to-digital converter may include a ramp signal generation unit suitable for decreasing a voltage range of a ramp signal in proportion to a margin coefficient and in reverse proportion to a multiple of a gain and repeatedly generating the ramp signal by the multiple of the gain; a comparator suitable for repeatedly outputting a comparison signal by the multiple of the gain in response to the ramp signal; a counter suitable for performing a counting operation in response to the comparison signal; and an overflow notification unit suitable for detecting an overflow of the counter and providing notification of the detected overflow.

In an embodiment, a complementary metal oxide semiconductor (CMOS) image sensor may include a pixel suitable for outputting a pixel signal corresponding to incident light; a row decoder suitable for selecting and controlling the pixel; a ramp signal generation unit suitable for reducing a voltage range of a ramp signal in reverse proportion to a multiple of a gain and repeatedly generating the ramp signal by the multiple of the gain; a comparator suitable for repeatedly outputting a comparison signal by the multiple of the gain in response to the ramp signal; a counter suitable for performing a counting operation in response to the comparison signal; a memory unit suitable for storing counting information from the counter; and a column readout circuit suitable for outputting data of the memory.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Furthermore, throughout this specification, when it is described that one element is "coupled" to the other element, the one element may be "directly coupled" to the other element or may be "electrically coupled" to the other element through a third element. Furthermore, when it is said that one element "include" or "comprises" the other element, the word "include" or "comprise" will be understood to imply the inclusion of stated elements but not the exclusion of any other elements, unless explicitly described to the contrary. Furthermore, some elements have been described as the singular form throughout this specification, but the present invention is not limited thereto. It will be understood that a corresponding element may be plural.

It is further noted that the drawings are simplified schematics and as such are not necessarily drawn to scale. In some instances, various parts of the drawings may have been exaggerated in order to more clearly illustrate certain features of the illustrated embodiments.

Also, in the following description, specific details are set forth for facilitating the understanding of the present invention, however, the present invention may be practiced without some of these specific details. Moreover, well-known structures and/or processes may have been omitted or only described briefly to avoid obscuring the present disclosure with unnecessary well known details.

It is also noted, that in some instances, as would be apparent to those skilled in the relevant art, an element (also referred to as a feature) described in connection with one embodiment may be used singly or in combination with other elements of another embodiment, unless specifically indicated otherwise.

Figure 1:
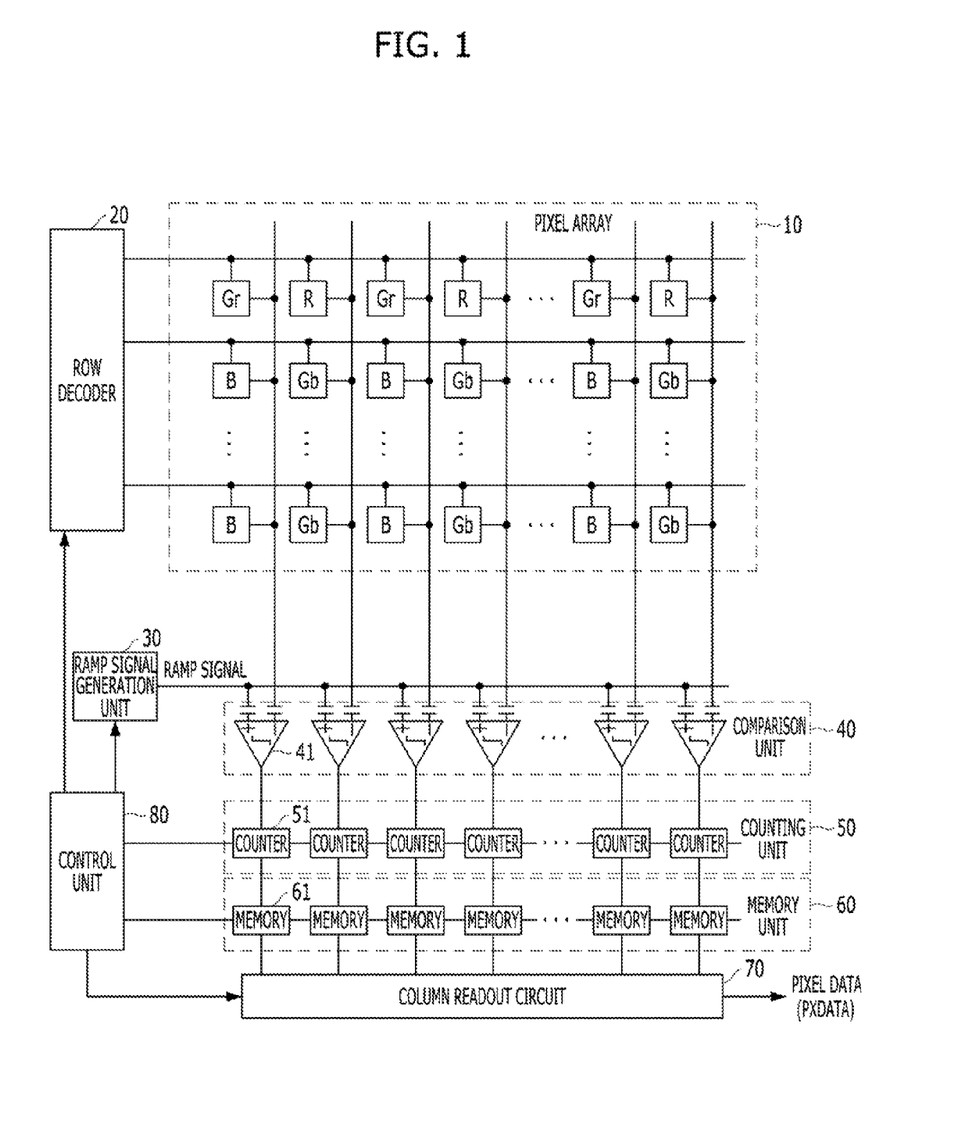
FIG. 1 is a circuit diagram showing an exemplary configuration of a CIS.

FIG. 1 is a circuit diagram showing the configuration of a CIS having a common column-parallel structure.

Referring to FIG. 1, the CIS may include a pixel array 10, a row decoder 20, a ramp signal generation unit 30, a comparison unit 40, a counting unit 50, a memory unit 60, a column readout circuit 70 and a control unit 80. In operation, the pixel array 10 outputs a pixel signal corresponding to incident light. The row decoder 20 selects a pixel within the pixel array 10 for each row line under the control of the control unit 80 (e.g., a timing generator) and controls the operation of the pixel. The ramp signal generation unit 30 generates a ramp signal under the control of the control unit 80. The comparison unit 40 compares the value of each pixel signal output by the pixel array 10 with the value of a ramp signal applied by the ramp signal generation unit 30. The counting unit 50 counts a clock from the control unit 80 in response to each output signal from the comparison unit 40. The memory unit 60 stores counting information from the counting unit 50 under the control of the control unit 80. The control unit 80 controls the operations of the row decoder 20, the ramp signal generation unit 30, the counting unit 50, the memory unit 60 and the column readout circuit 70. The column readout circuit 70 sequentially outputs the data of the memory unit 60 as pixel data PXDATA under the control of the control unit 80.

In order to remove an offset value of a pixel itself, the CIS is configured to compare a pixel signal (or a pixel output voltage) before a light signal is incident with a pixel signal (or a pixel output voltage) after the light signal is incident and to thus measure only a pixel signal generated by actual incident light. Such a technique is referred to as a correlated double sampling (CDS). The CDS function is performed by the comparison unit 40.

The comparison unit 40 includes a plurality of comparators, the counting unit 50 includes a plurality of counters, and the memory unit 60 includes a plurality of memories, all arranged in columns. For example, the comparator 41, the counter 51 and the memory 61 are provided in each column.

Operations of one comparator and one counter in a first column are described below as an example.

The comparator 41 receives a pixel signal PX output by the first column of the pixel array 10 through a first terminal receives a ramp signal $V_{RAMP}$ applied by the ramp signal generation unit 30 through a second terminal, compares the value of the pixel signal PX with the value of the ramp signal $V_{RAMP}$, and outputs a comparison signal.

The ramp signal $V_{RAMP}$ is a signal whose voltage level increases (or decreases) over time. As a result, there is a point of time at which the values of the pixel signal and ramp signal inputted to the comparator become identical. The value of the comparison signal output by the comparator is inversed after the lapse of the identical point of time.

Accordingly, the counter 51 counts a clock from the control unit 80 from a point of time at which a ramp signal rises (or falls) to a point of time at which a comparison signal output by the comparator 41 is inversed, and outputs counting information. At this time, the counter 51 is reset in response to a reset signal from the control unit 80.

In this case, there is no need for a special preparation for an overflowed counting value because the counter 51 is an N-bit counter (where N is a natural number), for example, and is configured to not operate with N bits or more.

Figure 2A:
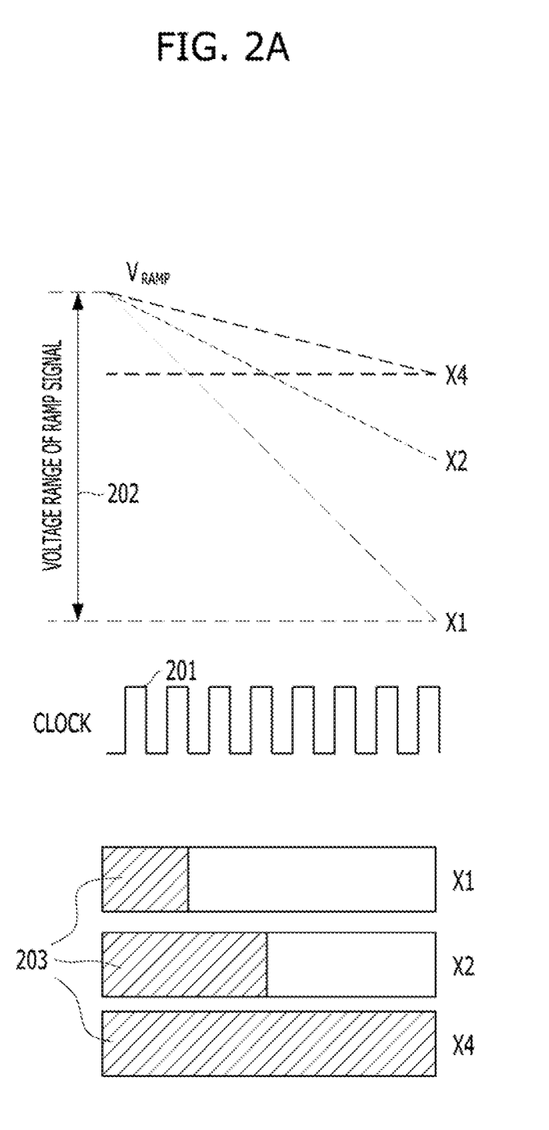
FIG. 2A is a diagram showing an example of a gain increase method used in the CIS of FIG. 1.

FIG. 2A is a diagram showing an example of a gain increase method used in a CIS.

As shown in FIG. 2A, as an example, if the speed of a clock 201 is to be maintained in the same manner as the existing speed, a method for decreasing the voltage range 202 of a ramp signal $V_{RAMP}$ (or a ramp output voltage) by a multiple of a gain may be used to increase an analog gain. For example, the voltage range of the ramp signal when the gain is "2" (×2) corresponds to ½ of the voltage range of the ramp signal when the gain is "1" (×1). The voltage range of the ramp signal when the gain is "4" (×4) corresponds to ½ of the voltage range of the ramp signal when the gain is "2" (×2).

As the analog gain increases, the number of actually counted bits 203 increases by the multiple of the gain. For example, the number of actually counted bits when the gain is "2" (×2) is two times greater than the number of actually counted bits when the gain is "1" (×1). The number of actually counted bits when the gain is "4" (×4) is two times greater than the number of actually counted bits when the gain is "2" (×2).

However, in accordance with the method for decreasing the voltage range of a ramp signal as described above, the signal-to-noise ratio (SNR) is deteriorated because the signal versus noise is decreased.

Figure 2B:
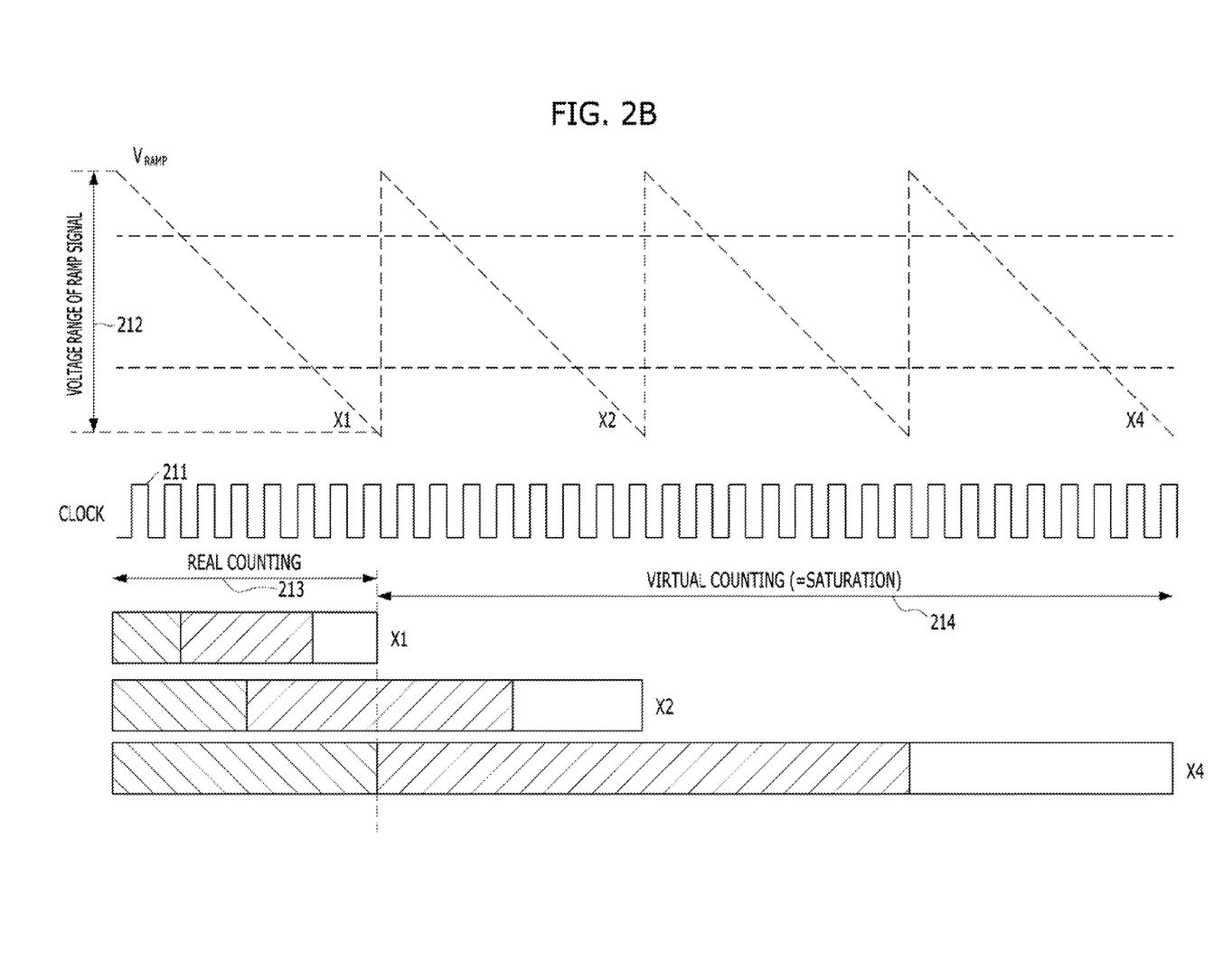
FIG. 2B is a diagram showing an example of an overflow counting gain adjustment method used in a CIS.

Accordingly, an overflow counting gain adjustment method, such as that shown in FIG. 2B, may be taken into consideration.

FIG. 2B is a diagram showing an example of an overflow counting gain adjustment method used in a CIS.

As shown in FIG. 2B, for example, if the voltage range 212 of a ramp signal $V_{RAMP}$ and the speed of a clock 211 are to be maintained in the same manner as the existing voltage range and speed, respectively, a method for counting a count in response to a comparison signal that is repeated by a multiple of a gain and discarding an overflowed counting value may be used to increase an analog gain. For example, when the gain is "2" (×2), counting may be repeated two times compared to a case where the gain is "1" (×1) and an overflowed counting value may be discarded. When the gain is "4" (×4), counting may be repeated two times compared to a case where the gain is "2" (×2) and an overflowed counting value may be discarded.

At this time, the number of virtual counting bits 214 increases according to the multiple of the gain. In this case, a virtual counting portion is a portion discarded as the overflowed counting value. Accordingly, the number of real counting bits 213 has the same value regardless of an increase of the analog gain.

For example, in general, a maximum number of counting bits Max-Count may be calculated as in Equation 1.

$$\text{Max\_Count} = 2^N \cdot \text{AG} \qquad (1)$$

In Equation 1, N is the number of counting bits of the counter, and AG is a multiple of the analog gain.

In accordance with Equation 1, when the gain is "1" (×1), a maximum number of counting bits Max-Count is $2^N$. When the gain is "2" (×2), a maximum number of counting bits Max-Count is $2^{N+1}$. When the gain is "4" (×4), a maximum number of counting bits Max-Count is $2^{N+2}$.

In the overflow counting gain adjustment method, the number of real counting bits 213 (i.e., a maximum number of counting bits) has the same value of $2^N$ regardless of whether the analog gain increases from one time to two times or four times because a virtual counting portion (i.e., an overflowed counting portion) is discarded.

In the overflow counting gain adjustment method, an analog gain may be increased without the deterioration of another analog characteristic by maintaining the voltage range of a ramp signal (or a ramp output voltage) and the speed of a clock in the same manner as the existing voltage range and speed when the analog gain increases, counting a clock in response to a comparison signal that is repeated by a multiple of a gain and discarding an overflowed counting value. Therefore, the operation speed of an ADC may decrease as the analog gain increases and thus an operating time increases.

Accordingly, in accordance with an embodiment of the present invention, in an ADC repeatedly operating in proportion to a gain, the operation speed of the ADC can be enhanced by reducing the voltage range of a ramp signal in reverse proportion to a gain, thereby being capable of reducing an operating time. This is described in detail below with reference to FIGS. 3A to 4C.

Figure 3A:
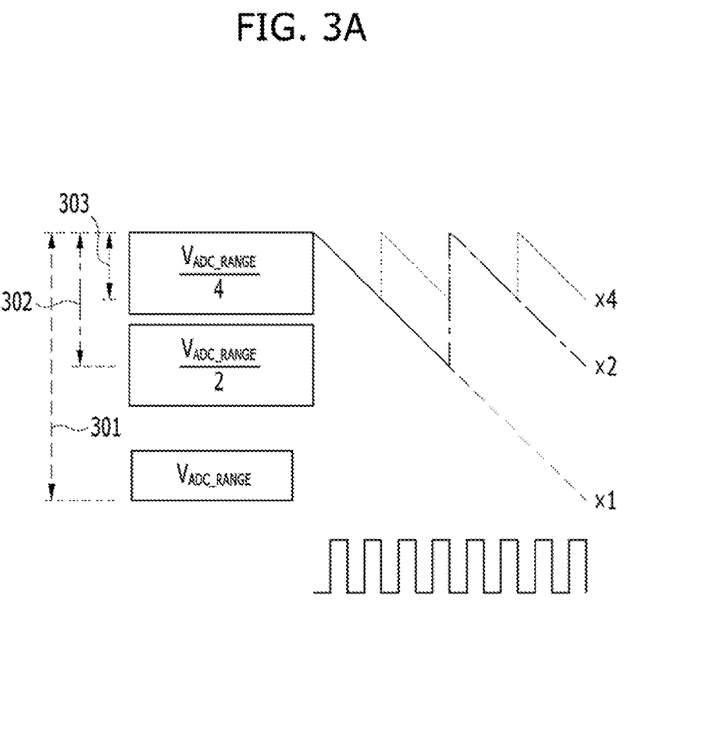
FIG. 3A is a diagram showing a gain increase method in accordance with an embodiment of the present invention.

FIG. 3A is a diagram showing a gain increase method in accordance with an embodiment of the present invention.

In the overflow counting gain adjustment method described with reference to FIG. 2B, when a gain increases, a voltage in which the voltage range of a ramp signal exceeds a maximum number of counting bits of a counter cannot be used. Accordingly, as shown in FIG. 3A, in a gain increase method in accordance with an embodiment of the present invention, the operating time of the ADC may be reduced by reducing the waveform of a ramp signal corresponding to a portion that exceeds a maximum number of counting bits of a counter.

That is, in the gain increase method in accordance with an embodiment of the present invention, in the ADC repeatedly operating in proportion to a gain, the operation speed of the ADC can be enhanced by reducing the voltage range of a ramp signal in reverse proportion to a gain, thereby being capable of reducing the operating time.

For example, assuming that the voltage range of a ramp signal that may be determined by the ADC when a gain is "1" (×1) is "$V_{ADC\_RANGE}$" (301), the voltage range of the ramp signal when the gain is "2" (×2) is reduced to ½ of the voltage range of the ramp signal when the gain is "1" (×1), so the voltage range of the ramp signal becomes "$V_{ADC\_RANGE}/2$" (302). The voltage range of the ramp signal when the gain is "4" (×4) is reduced to ¼ of the voltage range of the ramp signal when the gain is "1" (×1), so the voltage range of the ramp signal becomes "$V_{ADC\_RANGE}/4$" (303).

In this case, if the voltage range of the ramp signal when the gain is "2" (×2) is reduced to ½ of the voltage range of the ramp signal when the gain is "1" (×1), an operating time that it takes to perform an operation once is reduced to ½ of the operating time when the gain is "1" (×1). If the operations are performed twice, the operating time of the ADC when the gain is "2" (×2) becomes identical to that when the gain is "1" (×1). Furthermore, if the voltage range of the ramp signal when the gain is "4" (×4) is reduced to ¼ of the voltage range of the ramp signal when the gain is "1" (×1), an operating time that it takes to perform an operation once is reduced to half of that when the gain is "1" (×1). If the operation is performed four times, the operating time of the ADC when the gain is "4" (×4) becomes identical to that when the gain is "1" (×1).

Furthermore, in the gain increase method in accordance with an embodiment of the present invention, a maximum number of counting bits $MAX_{Count}$ may be calculated as in Equation 2.

$$MAX_{Count} = \frac{2^N}{AG} \cdot AG = 2^N \qquad (2)$$

In Equation 2, N is the number of counting bits of a counter, and AG is a multiple of an analog gain.

In accordance with Equation 2, a maximum number of counting bits is $2^N$ when the gain is "1" (×1), when the gain is "2" (×2) or when the gain is "4" (×4).

Figure 3B:
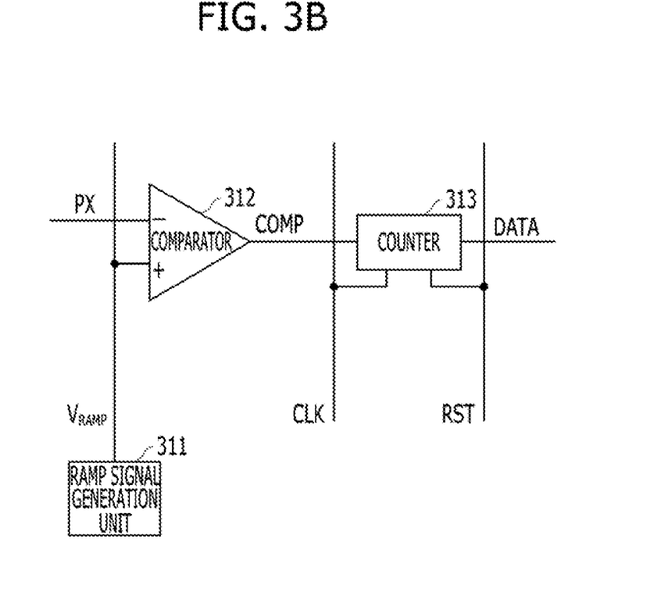
FIG. 3B is a diagram showing an ADC in accordance with an embodiment of the present invention.

FIG. 3B is a diagram showing an ADC in accordance with an embodiment of the present invention, and shows the configuration of the ADC in one column.

Referring to FIG. 3B, the ADC may include a ramp signal generation unit 311, a comparator 312 and a counter 313. The ramp signal generation unit 311 is configured to reduce the voltage range of a ramp signal in reverse proportion to a multiple of a gain and repeatedly generate a ramp signal $V_{RAMP}$ by a multiple of a gain under the control of a control unit (e.g., the control unit 80). The comparator 312 is configured to repeatedly output a comparison signal COMP by the multiple of the gain in response to the ramp signal $V_{RAMP}$ that is repeatedly generated by the multiple of the gain by the ramp signal generation unit 311. The counter 313 is configured to perform a counting operation in response to the comparison signal COMP from the comparator 312.

The ramp signal generation unit 311 may reduce the voltage range of a ramp signal in reverse proportion to a multiple of a gain and generate a ramp signal $V_{RAMP}$ by repeatedly operating by the multiple of the gain during one low time. In this case, information about the multiple of the gain may be received from the control unit 80 or may be set by the ramp signal generation unit 311.

The comparator 312 may receive a pixel signal PX from the pixel array 10 of FIG. 1 through one terminal, receive the ramp signal $V_{RAMP}$ from the ramp signal generation unit 311 through the other terminal, compare the value of the pixel signal PX with the value of the ramp signal $V_{RAMP}$, and repeatedly output a comparison signal COMP based on the comparison result.

The ramp signal $V_{RAMP}$ from the ramp signal generation unit 311 may be a signal whose voltage range is reduced in reverse proportion to a multiple of a gain and whose voltage level increase (or decrease) over time is repeated by the multiple of the gain during one low time. As a result, a point of time at which the pixel signal PX and ramp signal $V_{RAMP}$ received in the comparator 312 are the same is repeatedly generated by the multiple of the gain. The value of the comparison signal COMP output by the comparator 312 is inversed after a lapse of the identical point.

Accordingly, the counter 313 may output counting information DATA by performing an operation for counting a clock CLK from the control unit 80 from a point of time at which the ramp signal $V_{RAMP}$ falls (or rises) to a point of time at which the comparison signal COMP repeatedly output by the multiple of the gain by the comparator 312 is inversed. At this time, the counter 313 may be reset in response to a reset signal RST from the control unit 80.

Figure 4A:
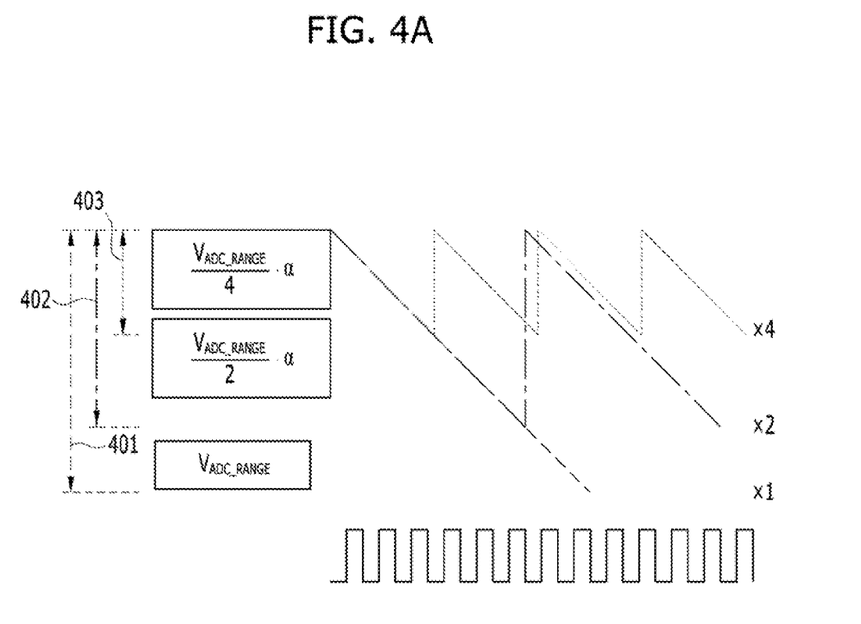
FIG. 4A is a diagram showing an overflow counting gain adjustment method in accordance with another embodiment of the present invention.

FIG. 4A is a diagram showing an overflow counting gain adjustment method in accordance with another embodiment of the present invention.

Referring to FIG. 4A, the overflow counting gain adjustment method may be an operating method of applying a margin (e.g., a margin coefficient α is 1.5) of a specific multiple (e.g., 1.5 times in FIG. 4A) to the voltage range of a ramp signal $V_{RAMP}$, compared to the gain increase method of FIG. 3A.

The overflow counting gain adjustment method in accordance with another embodiment of the present invention adopts a method for reducing the voltage range of a ramp signal in reverse proportion to a gain, while applying a margin of a specific multiple to the voltage range of the ramp signal used in the ADC repeatedly operating in proportion to a gain.

For example, assuming that the voltage range of a ramp signal $V_{RAMP}$ that may be determined by the ADC when a gain is "1" (×1) is "$V_{ADC\_RANGE}$" (401), the voltage range of the ramp signal when the gain is "2" (×2) is reduced to α/2 of the voltage range of the ramp signal when the gain is "1" (×1), so the voltage range of the ramp signal becomes "$\alpha \times V_{ADC\_RANGE}/2$" (402). The voltage range of the ramp signal when the gain is "4" (×4) is reduced to α/4 of the voltage range of the ramp signal when the gain is "1" (×1), so the voltage range of the ramp signal becomes "$\alpha \times V_{ADC\_RANGE}/4$" (403).

In this case, the margin coefficient α may have a value that is more than 1 and less than 2.

As described above, in accordance with the overflow counting gain adjustment method of FIG. 4A, if a margin is applied to the voltage range of a ramp signal $V_{RAMP}$, the operating time is increased compared to the gain increase method of FIG. 3A, but some problems that may be generated in a node of a ramp signal can be reduced. Furthermore, the operating time can be significantly reduced compared to the overflow counting gain adjustment method of FIG. 2B.

Furthermore, in accordance with the overflow counting gain adjustment method, a maximum number of counting bits $MAX_{Count}$ may be calculated as in Equation 3.

$$MAX_{Count} = \frac{2^N}{AG} \cdot \alpha \cdot AG = 2^N \cdot \alpha \quad (3)$$

In Equation 3, N is the number of counting bits of a counter, AG is a multiple of an analog gain, and a is a margin coefficient.

In accordance with Equation 3, a maximum number of counting bits is $2^N \times \alpha$ when the gain is "1" (×1), when the gain is "2" (×2) or when the gain is "4" (×4).

Figure 4B:
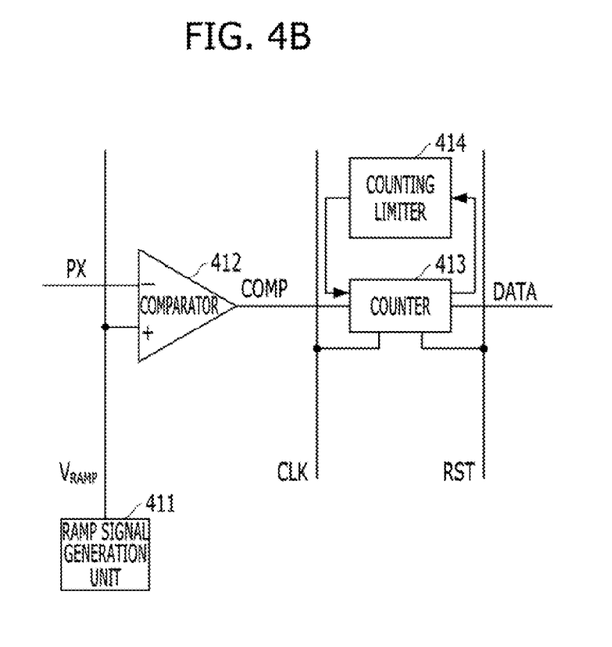
FIG. 4B is a diagram showing an ADC in accordance with another embodiment of the present invention.

FIG. 4B is a diagram showing an ADC in accordance with another embodiment of the present invention, and shows the configuration of the ADC in one column.

Referring to FIG. 4B, the ADC may include a ramp signal generation unit 411, a comparator 412, a counter 413 and a counting limiter 414. The ramp signal generation unit 411 is configured to reduce the voltage range of a ramp signal in proportion to a margin coefficient and in reverse proportion to a multiple of a gain and repeatedly generate a ramp signal $V_{RAMP}$ by the multiple of the gain under the control of a control unit (e.g., the control unit 80). The comparator 412 is configured to repeatedly output a comparison signal COMP by the multiple of the gain in response to the ramp signal $V_{RAMP}$ that is repeatedly generated by the multiple of the gain by the ramp signal generation unit 411. The counter 413 is configured to perform a counting operation in response to the comparison signal COMP from the comparator 412. The counting limiter 414 is configured to limit the number of counting bits of the counter 413 to the number of real counting bits (i.e., a maximum number of counting bits).

The ramp signal generation unit 411 may reduce the voltage range of a ramp signal in proportion to a margin coefficient α and in reverse proportion to a multiple of a gain and generate a ramp signal $V_{RAMP}$ by repeatedly operating by the multiple of the gain during one low time. In this case, information about the multiple of the gain and the margin coefficient may be received from the control unit 80 or may be set by the ramp signal generation unit 411.

The comparator 412 may receive a pixel signal PX from the pixel array 10 of FIG. 1 through one terminal, receive the ramp signal $V_{RAMP}$ from the ramp signal generation unit 411 through the other terminal, compare the value of the pixel signal PX with the value of the ramp signal $V_{RAMP}$, and repeatedly output a comparison signal COMP based on the comparison result.

The ramp signal $V_{RAMP}$ from the ramp signal generation unit 411 may be a signal whose voltage range is reduced in proportion to a margin coefficient and in reverse proportion to a multiple of a gain and whose voltage level increasing (or decreasing) over time is repeated by the multiple of the gain during one low time. As a result, a point of time at which the pixel signal PX and ramp signal $V_{RAMP}$ received in the comparator 312 are the same is repeatedly generated by the multiple of the gain. The value of the comparison signal COMP output by the comparator 312 is inversed after lapse of the identical point.

Accordingly, the counter 413 may output counting information DATA and a carry-out signal by performing an operation for counting a clock CLK from the control unit 80 from a point of time at which the ramp signal $V_{RAMP}$ falls (or rises) to a point of time at which the comparison signal COMP repeatedly output by the multiple of the gain by the comparator 412 is inversed. At this time, the counter 413 may be reset in response to a reset signal RST from the control unit 80.

The counter 413 may be implemented by changing its entire configuration into a configuration in which a counting value is not overflowed. For example, the counter 413 may be implemented using an N-bit non-overflow counter.

Furthermore, the counting limiter 414 may stop counting by disabling the counter 413 when the counter 413 counts the number of real counting bits (i.e., a maximum number of counting bits) before the counting is completed. Accordingly, the counter 413 may stop counting, maintain the current number of real counting bits (i.e., a maximum number of counting bits), and output the counting information DATA to a digital block (not shown) through the column readout circuit 70 of FIG. 1. When a counter enable signal is applied as a next low time starts, the counter 413 may perform counting again.

More specifically, the counting limiter 414 may receive the carry-out signal (i.e., an N-th carry-out bit in the case of an N-bit counter) of the last bit from the counter 413, and may disable the counter 413 by applying a counter disable signal to the counter 413. In this case, the counting limiter 414 may be implemented using a comparison unit.

Figure 4C:
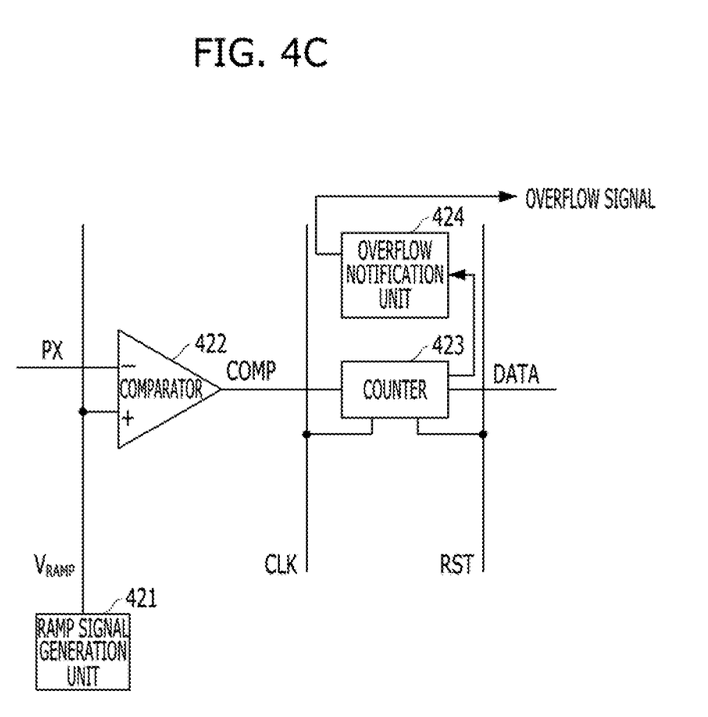
FIG. 4C is a diagram showing an ADC in accordance with yet another embodiment of the present invention.

FIG. 4C is a diagram showing an ADC in accordance with yet another embodiment of the present invention.

Referring to FIG. 4C, the ADC may include a ramp signal generation unit 421, a comparator 422, a counter 423 and an overflow notification unit 424. The ramp signal generation unit 421 is configured to reduce the voltage range of a ramp signal in proportion to a margin coefficient and in reverse proportion to a multiple of a gain and repeatedly generate a ramp signal $V_{RAMP}$ by the multiple of the gain under the control of a control unit (e.g., the control unit 80). The comparator 422 is configured to repeatedly output a comparison signal COMP by the multiple of the gain in response to the ramp signal $V_{RAMP}$ repeatedly generated by the multiple of the gain by the ramp signal generation unit 421. The counter 423 is configured to perform a counting operation in response to the comparison signal COMP from the comparator 422. The overflow notification unit 424 is configured to detect an overflow of the counter 423 and provide notification of the overflow.

The configuration and operation of the ramp signal generation unit 421, the comparator 422 and the counter 423 are substantially the same as those of the ramp signal generation unit 411, the comparator 412 and the counter 413 of FIG. 4B, and thus a further description thereof is omitted. In this case, the counter 423 may be implemented using a ripple counter, for example, other than the N-bit non-overflow counter.

The overflow notification unit 424 may detect an overflow of the carry-out signal (i.e., an N-th carry-out bit in the case of an N-bit counter) of the last bit received from the counter 423, and output the overflow signal to a digital block (not shown) through the column readout circuit 70 of FIG. 1. The digital block may receive the overflow signal, and perform processing (i.e., discarding counting information after a maximum number of counting bits) by unconditionally limiting corresponding counting information to the number of real counting bits (i.e., a maximum number of counting bits). In this case, the overflow notification unit 424 may be implemented using a comparator.

Furthermore, in the configuration of the ripple counter, the last bit changes from a low level to a low level via a high level (i.e., low-high-low). Accordingly, the overflow notification unit 424 may be efficiently implemented because it can recognize an overflow by detecting the value and has only to route only a 1-bit signal to an overflow signal.

The ADC described with reference to FIGS. 3A to 4C may be applied to the CIS described with reference to FIG. 1.

In accordance with an embodiment of the present invention, an analog gain can be increased and an operation speed can be improved without the deterioration of an analog characteristic because an operation is repeated in proportion to a gain.

That is, in accordance with an embodiment of the present invention, an operating time can be reduced through the improvement of an operation speed because an operation is repeated in proportion to a gain, but the voltage range of a ramp signal is reduced in reverse proportion to the gain.

Although various embodiments have been described for illustrative purposes, it will be apparent to those skilled in the art that various changes and modifications may be made without departing from the spirit and scope of the invention as defined in the following claims.

What is claimed is:

1. An analog-to-digital converter, comprising:
   a ramp signal generation unit suitable for decreasing a voltage range of a ramp signal in reverse proportion to a multiple of a gain and in proportion to a margin coefficient, and repeatedly generating the ramp signal by the multiple of the gain;
   a comparator suitable for repeatedly outputting a comparison signal by the multiple of the gain in response to the ramp signal; and
   a counter suitable for performing a counting operation in response to the comparison signal.

2. The analog-to-digital converter of claim 1, wherein the ramp signal generation unit is suitable for repeatedly generating the ramp signal by the multiple of the gain during one low time.

3. The analog-to-digital converter of claim 1, wherein the comparator is suitable for:
   receiving a pixel signal through a first terminal;
   receiving the ramp signal whose voltage range is reduced in reverse proportion to the multiple of the gain and which is repeated by the multiple of the gain during one low time" through a second terminal;
   comparing the pixel signal with the ramp signal; and
   repeatedly outputting the comparison signal by the multiple of the gain.

4. The analog-to-digital converter of claim 1, wherein the counter is suitable for outputting counting information by performing an operation for counting a clock from a point of time at which the ramp signal falls to a point of time at which the comparison signal repeatedly output by the multiple of the gain is inversed.

5. The analog-to-digital converter of claim 1, further comprising a counting limiter suitable for limiting a number of counting bits of the counter to a maximum number of counting bits and
   wherein the ramp signal generation unit is suitable for repeatedly generating the ramp signal by the multiple of the gain during one low time.

6. The analog-to-digital converter of claim 1, wherein the comparator is suitable for:
   receiving a pixel signal through a first terminal;
   receiving the ramp signal whose voltage range is reduced in proportion to the margin coefficient and in reverse proportion to the multiple of the gain and which is repeated by the multiple of the gain during one low time through a second terminal;
   comparing the pixel signal with the ramp signal; and
   repeatedly outputting the comparison signal by the multiple of the gain.

7. The analog-to-digital converter of claim 1, wherein the counter is suitable for outputting counting information and a carry-out signal by performing an operation for counting a clock from a point of time at which the ramp signal falls to a point of time at which the comparison signal repeatedly output by the multiple of the gain is inversed.

8. The analog-to-digital converter of claim 7, wherein the counter includes a non-overflow counter.

9. The analog-to-digital converter of claim 5, wherein the counting limiter is suitable for stopping counting by disabling the counter when the counter counts the maximum number of counting bits before the counting is completed.

10. The analog-to-digital converter of claim 5, wherein the counting limiter is suitable for receiving a carry-out signal of a last bit from the counter and disabling the counter by applying a counter disable signal to the counter.

11. An analog-to-digital converter, comprising:
   a ramp signal generation unit suitable for decreasing a voltage range of a ramp signal in proportion to a margin coefficient and in reverse proportion to a multiple of a gain and repeatedly generating the ramp signal by the multiple of the gain;
   a comparator suitable for repeatedly outputting a comparison signal by the multiple of the gain in response to the ramp signal;
   a counter suitable for performing a counting operation in response to the comparison signal; and an overflow notification unit suitable for detecting an overflow of the counter and providing notification of the detected overflow.

12. The analog-to-digital converter of claim 11, wherein the ramp signal generation unit is suitable for repeatedly generating the ramp signal by the multiple of the gain during one low time.

13. The analog-to-digital converter of claim 11, wherein the comparator is suitable for:
receiving a pixel signal through first terminal;
receiving the ramp signal whose voltage range is reduced in proportion to the margin coefficient and in reverse proportion to the multiple of the gain and which is repeated by the multiple of the gain during one low time through a second terminal;
comparing the pixel signal with the ramp signal; and
repeatedly outputting the comparison signal by the multiple of the gain.

14. The analog-to-digital converter of claim 11, wherein the counter is suitable for outputting counting information and a carry-out signal by performing an operation for counting a clock from a point of time at which the ramp signal falls to a point of time at which the comparison signal repeatedly output by the multiple of the gain is inversed.

15. The analog-to-digital converter of claim 11, wherein the overflow notification unit is suitable for detecting an overflow in response to a carry-output signal of a last bit received from the counter and outputting an overflow signal.

16. A complementary metal oxide semiconductor (CMOS) image sensor, comprising:
a pixel suitable for outputting a pixel signal corresponding to incident light;
a row decoder suitable for selecting and controlling the pixel;
a ramp signal generation unit suitable for reducing a voltage range of a ramp signal in reverse proportion to a multiple of a gain and repeatedly generating the ramp signal by the multiple of the gain;
a comparator suitable for repeatedly outputting a comparison signal by the multiple of the gain in response to the ramp signal;
a counter suitable for performing a counting operation in response to the comparison signal;
a memory unit suitable for storing counting information from the counter; and
a column readout circuit suitable for outputting data of the memory.

17. The complementary metal oxide semiconductor (CMOS) image sensor of claim 16, further comprising:
a counting limiter suitable for limiting a number of counting bits of the counter to a maximum number of counting bits.

18. The complementary metal oxide semiconductor (CMOS) image sensor of claim 16, further comprising:
an overflow notification unit suitable for detecting an overflow of the counter and providing notification of the detected overflow.

* * * * *